(12) United States Patent
Lee (10) Patent No.: US 6,762,633 B2
(45) Date of Patent: Jul. 13, 2004

(54) DELAY LOCKED LOOP CIRCUIT WITH IMPROVED JITTER PERFORMANCE

(75) Inventor: Seong Hoon Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/315,382

(22) Filed: Dec. 10, 2002

(65) Prior Publication Data

US 2003/0117193 A1 Jun. 26, 2003

(30) Foreign Application Priority Data

Dec. 21, 2001 (KR) ................................. 10-2001-0082675

(51) Int. Cl.[7] ................................................ H03L 7/06
(52) U.S. Cl. ........................ 327/158; 327/161; 327/149
(58) Field of Search ................................ 327/158, 161, 327/149, 152, 153, 2, 3, 5, 7, 12

(56) References Cited

U.S. PATENT DOCUMENTS

| | | | | |
|---|---|---|---|---|
| 5,940,344 | A | * | 8/1999 | Murai et al. ................. 365/233 |
| 6,437,618 | B2 | * | 8/2002 | Lee ............................. 327/158 |
| 6,614,278 | B2 | * | 9/2003 | Kim et al. ................... 327/263 |

* cited by examiner

Primary Examiner—Timothy P. Callahan
Assistant Examiner—Cassandra Cox
(74) Attorney, Agent, or Firm—Ladas & Parry

(57) ABSTRACT

A delay locked loop circuit with a novel structure for improving a jitter performance is disclosed. The delay locked loop circuit includes a delay circuit for receiving an input clock signal and generating a delayed output clock signal. The delay circuit has a predetermined minimum variable delay, and the output clock signal is delayed with respect to the input clock signal by a delay to be determined in accordance with a delay control signal inputted into the delay circuit. Moreover, the delay locked loop circuit includes a phase determining block for receiving the input clock signal and the output clock signal, generating a phase pull signal when a phase of an input clock signal being delayed by a first predetermined time period leads a phase of the output clock signal, and generating a phase push signal when a phase of the input clock signal lags behind a phase of a delayed output clock signal delayed by a second predetermined time, and a delay control circuit for generating the delay control signal for controlling the delay circuit to reduce the delay when the phase pull signal is received from the phase determining block and to increase the delay when the phase push signal is received from the phase determining block. The delay control circuit does not change the delay of the delay circuit when neither the phase pull signal nor the phase push signal is received from the phase determining block.

18 Claims, 6 Drawing Sheets

DELAY LOCKED LOOP CIRCUIT WITH IMPROVED JITTER PERFORMANCE

BACKGROUND OF THE INVENTION

1. Field of the Invention

The present invention relates to a delay locked loop circuit with an improved jitter performance, and more particularly to a delay locked loop circuit using a phase mixer for improved jitter performance by using a phase mixer. The delay locked loop circuit according to the present invention can be applicable to a semiconductor memory device and more particularly to all semiconductor devices and computer systems requiring a delay locked loop circuit.

2. Description of the Prior Art

Figure 1:
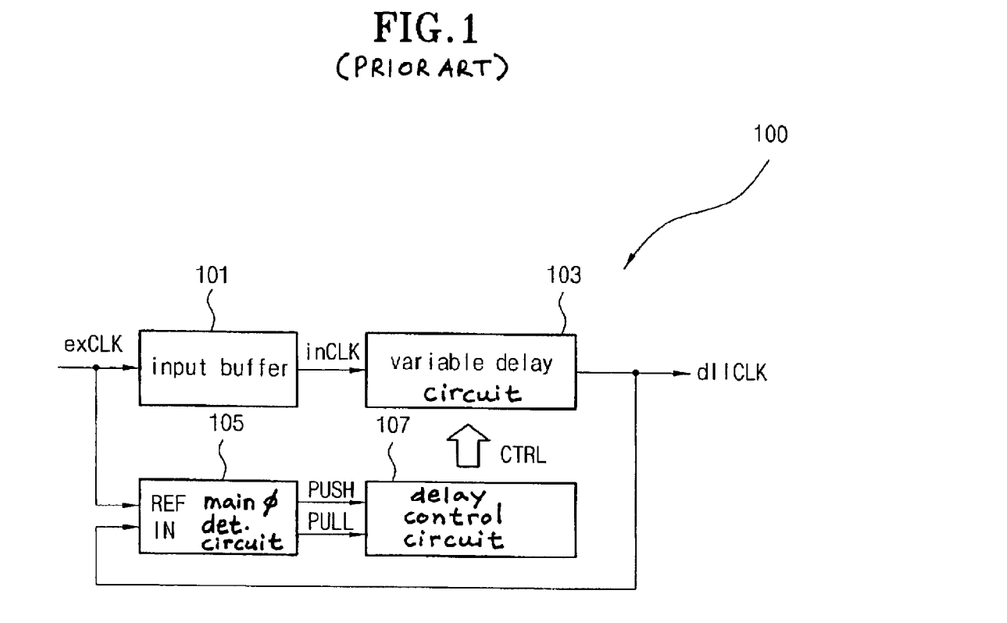
FIG. 1 is a block diagram of a conventional delay locked loop circuit for matching an output clock signal with an external clock signal.

As generally known in the art, the delay locked loop (hereinafter referred to "DLL") circuit is a clock generating device for compensating skew between an external clock and data, or an external clock and an internal clock. FIG. 1 is a block diagram illustrating an example of a conventional DLL circuit. An input buffer 101 in the conventional DLL circuit 100 receives and converts an external clock signal exCLK or a reference clock signal into an internal clock signal inCLK having a signal level suitable for an internal circuit. An variable delay circuit 103 receives the clock inCLK from the input buffer 101 and generates an output clock signal dIICLK by delaying for a predetermined time. A main phase determining circuit 105 receives the output clock signal dIICLK and the external clock signal exCLK and detects a phase difference between the two clock signals so that it generates a phase push signal PUSH when a phase of the output clock signal exCLK runs ahead of the phase of the external clock signal exCLK. In constrast, it generates a phase pull signal PULL when the phase of the output clock signal dIICLK lags behind the phase of the external clock signal. Although the main phase determining circuit 105 detects a phase difference between the output clock signal dIICLK and the external clock signal exCLK and generates the phase pull signal PULL or the phase push signal PUSH, since the circuit 100 in FIG. 1 is for arranging the output clock signal dIICLK and the external clock signal exCLK, there are possibilities for a plurality of variants of the main phase determining circuit 105 such as a circuit to use the internal clock signal inCLK and the output clock signal dIICLK as an input. A delay control circuit 107 receives the phase push signal PUSH or the phase pull signal PULL from the main phase determining circuit 105, generates a control signal CTRL for controlling a delayed amount of a variable delay line 104, and supplies the control signal CTRL to the variable delay circuit 103.

The DLL circuit 100 depicted in FIG. 1, as described above, corresponds to a case for obtaining an output clock signal dIICLK having a phase identical to the phase of the external clock signal exCLK. This can be achieved by properly adjusting the amount of the delay of the variable delay circuit 103. The main phase determining circuit 105 determines that the phase of the output clock signal dIICLK is slow by comparing the phases between the external clock signal exCLK ad the output clock signal dIICLK and activates the phase push signal PUSH. If the phase push signal PUSH is provided to the delay control circuit 107, the delay control circuit 107 generates the control signal CTRL which reflects the phase push signal PUSH, so that the amount of delay in the variable delay circuit 103 is slightly increased. The amount of the delay is increased little by little so that the phase of the output clock signal dIICLK will approach the phase of the external clock signal exCLK. In contrast, if the phase of the output clock signal dIICLK lags the phase of the external clock signal exCLK, the main phase determining circuit 105 activates the phase pull signal which results in the decrease of the amount of delay in the variable delay circuit 103 through the delay control circuit 107. Through the procedures described as above, the phase of the output clock signal dIICLK is adapted to the phase of the external clock signal exCLK. Under such conditions, the phase of the output clock signal dIICLK swings about the phase of the external clock signal exCLK at least by minimum variable delay amount (hereinafter referred to unit delay) to be increased or decreased by the phase push signal PUSH or the phase pull signal PULL.

Figure 2:
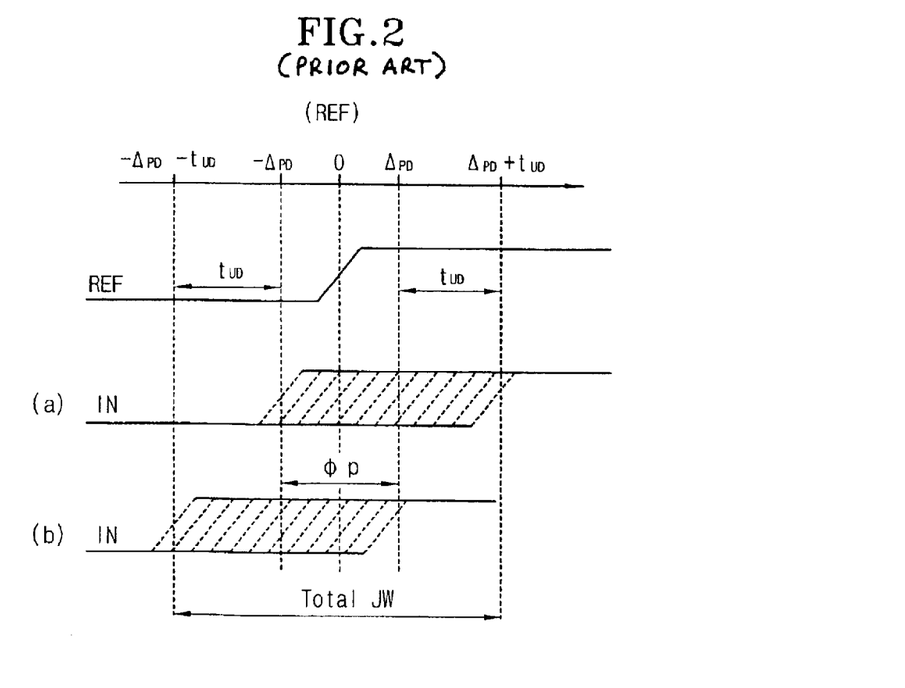
FIG. 2 is a view showing jitter performance of the circuit in FIG. 1.

The DLL has a variety of performance indices, one of the indices being jitter performance. The jitter means a swing amount as the phase of the DLL output signal reciprocates minutely. The less the amount of the jitter is, the superior the DLL is. Errors in the phase determining circuit and the unit delay of the variable delay line are restricted to factors affecting the jitter performance. Until now, the error and the unit delay have been used to enhance jitter performance by mainly improving each value thereof. FIG. 2 shows the jitter performance of the circuit in FIG. 1. When the phase of the reference signal is set to 0 (zero), the main phase determining circuit 105 should swing the phase of the output signal of the delay locked loop circuit 100 in FIG. 1 by at least the amount of error. When a maximum error of the main phase determining circuit 105 is set to $\Delta_{PD}$, a jitter window, an error area due to the main phase determining circuit 105, is represented in the equation 1, and corresponds to portions indicated by $\Phi P$ in FIGS. 2A and 2B.

$$|JW| < \Delta_{PD} \quad \text{[Equation 1]}$$

where the jitter is increased by the unit delay $t_{UD}$, it gets decreased due to the signals PUSH and PULL. When the jitter is increased toward the right side by the unit delay $t_{UD}$ due to the signal PUSH, as illustrated in FIG. 2A, the jitter window at that time is represented as equation 2. Meanwhile, as illustrated in FIG. 2B, when the jitter is increased toward the left side by the unit delay $t_{UD}$ due to the signal PULL, the jitter window thereof is represented as equation 3. Therefore, the jitter window becomes sum of the equations 2 and 3 finally and is expressed by equation 4. A maximum phase error $\Phi_{MAX}$ is expressed by the equation 5.

$$-\Delta_{PD} < JW_{a1} < \Delta_{PD} + t_{UD} \quad \text{[Equation 2]}$$

$$-\Delta_{PD} - t_{UD} < JW_{b1} < \Delta_{PD} \quad \text{[Equation 3]}$$

$$|JW_{fl}| < \Delta_{PD} + t_{UD} \quad \text{[Equation 4]}$$

$$|\Phi_{MAX1}| = \Delta_{PD} + t_{UD} \quad \text{[Equation 5]}$$

Figure 3:
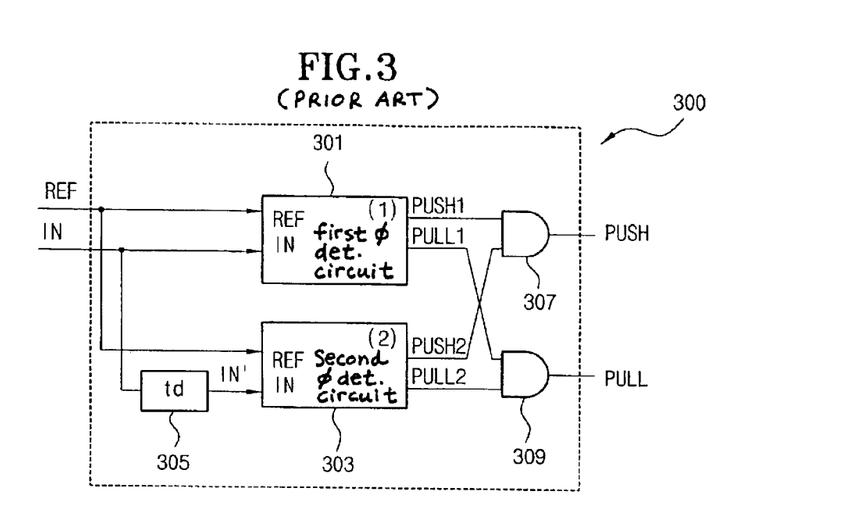
FIG. 3 is a block diagram of the conventional delay locked loop circuit for improving the jitter performance.

It can be understood that the jitter and the maximum phase error can be reduced by decreasing the $\Delta_{Pd}$ and $t_{UD}$, and also can be enhanced by other ways as shown in of FIGS. 2A and 2B. In other words, since, as shown in FIGS. 2A and 2B, the jitter windows are divergent from each other, the jitters can be reduced by as much as the amount in which two jitter windows overlap. FIG. 3 shows a block diagram of a conventional delay locked loop circuit for improving the jitter performance by using the facts. The main phase determining circuit 300, as shown in FIG. 3, includes two phase determining circuits 301 and 303, and a delay component 305 as essential components. Other characteristics are that the clock signal provided to an input signal terminal of the second phase determining circuit 303 passes through the delay component 305. In the description hereinafter, it is assumed that logic values of the signal PUSH or PULL become a logic high when the logic values are activated, and become a logic low when the values are not activated. Moreover, both of the signals PUSH and PULL, the outputs of one phase determining circuit cannot be logic high simultaneously. Only the signals must be determined as the logic high and or the logic low.

As shown in FIG. 3, the reference clock signal REF is directly provided to reference signal terminals REF of two phase determining circuits 301 and 303. Though an input signal IN is directly provided to an input signal terminal IN of the first phase determining circuit 301, a signal delayed as much as to is provided to an input signal terminal IN of the second phase determining circuit 303 via the delay component 305. Therefore, there is a time difference of as much as to between the signal provided to the input signal terminal IN of the first phase determining circuit 301 and the signal provided to the input signal terminal IN' of the second phase determining circuit 303. The phase push signal PUSH of the main phase determining circuit 300 is a result of performance of a logical product of the phase push signal PUSH1 of the first phase determining circuit 301 and the phase push signal PUSH2 of the second phase determining circuit 303 by using an AND gate 307. The phase pull signal PULL of the main phase determining circuit 300 is a result of performance of a logical product of the phase pull signal PULL1 of the first phase determining circuit 301 and the phase pull signal PULL2 of the second phase determining circuit 303 by using an AND gate 309.

Figure 4:
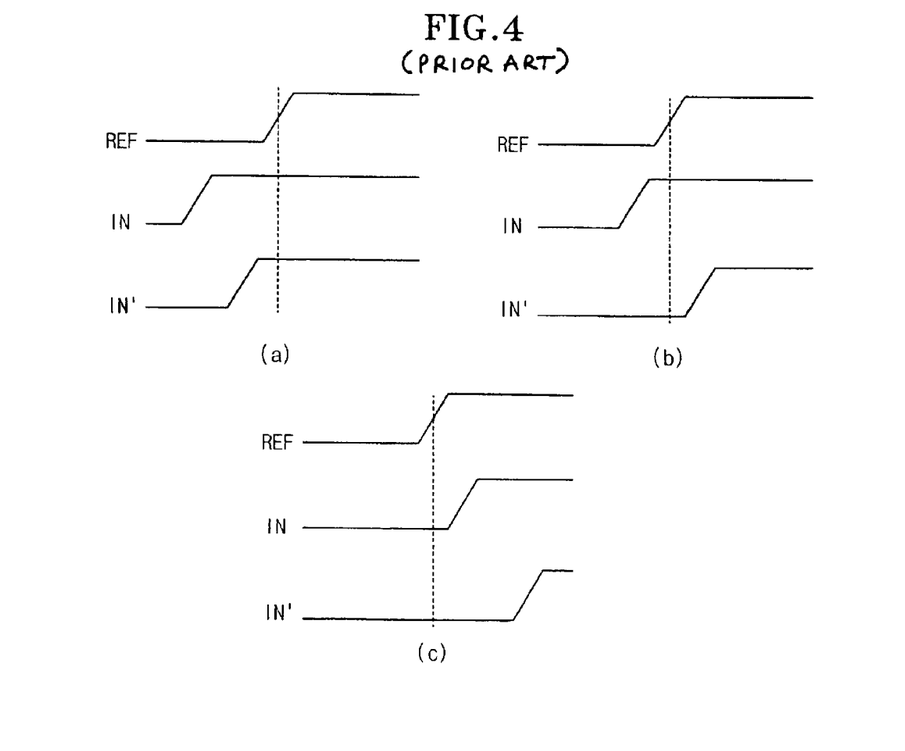
FIG. 4 is a view illustrating an operation principle of the circuit in FIG. 3.

Hereinafter, the principle of the operation of the circuit in FIG. 3 will be explained with reference to FIG. 4. As a matter of convenience for description, the error in the phase determining circuit is neglected. As shown in respective graphs of FIG. 4, the phase of the signal IN' is increased by to above the phase of the signal IN. First, since, in case of FIG. 4A, all phases of the input signals IN and IN' lead the phase of the reference signal REF, two phase determining circuits 301 and 303 would determine the case for the operation PUSH. In other words, since PUSH1 becomes high (PUSH1=high), PULL1 becomes low (PULL2=low), PUSH2 becomes high (PUSH2=high), and PULL2 becomes low (PULL2=low), finally it is determined to activate PUSH. In the case of FIG. 4B, since the input signal IN leads the reference signal REF and the input signal IN' lags the reference signal REF, the first phase determining circuit 301 determines the operation of PUSH and the second phase determining circuit 303 determines the operation of PULL. Namely, PUSH1 is high (PUSH1=high), PULL1 is low (PULL2=low), PUSH2 is low (PUSH2=low), and PULL2 is high (PULL2=high), final determination of the case of FIG. 4B becomes PUSH=PULL=low so that determination is not performed. Therefore, the delay change in the delay line does not occur. This state would be a locking state. Finally, in the case of FIG. 40, since both of phases of the input signals IN and IN' lag the phase of the reference signal REF, both of two phase determining circuits 301 and 303 determine PULL so that final determination becomes PULL. To sum up, if the determination results of two phase determining circuits 301 and 303 are same, the final determination prevails in the determination results, and if the determination results of two phase determining circuits 301 and 303 are different from each other, the final determination is assumed as a locking state so that the delay change in the delay line does not occur.

Figure 5:
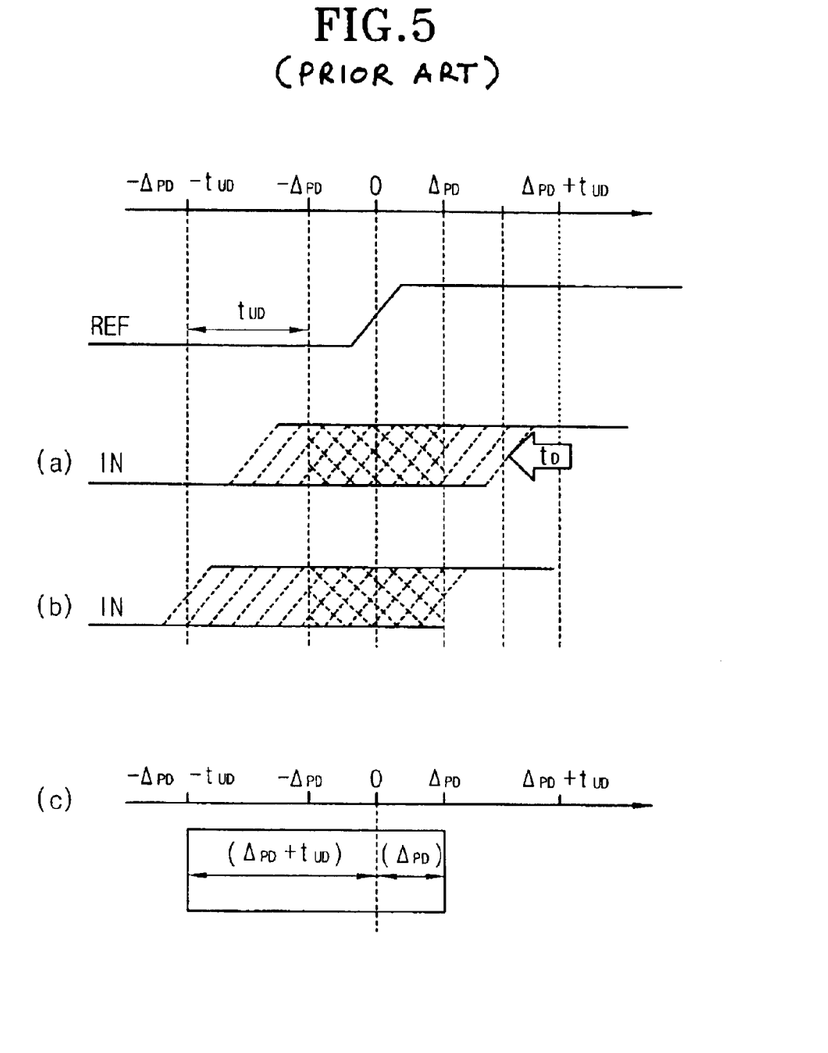
FIG. 5 is a view illustrating the jitter performance of the circuit in FIG. 3.

The jitter performance in this way is depicted in FIG. 5. Though it seems similar to that of FIG. 2 at a glance, since the main phase determining circuit 300 in FIG. 3, as shown as in FIG. 5A, has an effect to move the jitter window in the left direction by as much as to through the PUSH signal, the jitter window is converted into the following equation 6. The case of FIG. 5B is identical to the case of FIG. 2B and expressed by the equation 7. Namely, if, as described above, among the diverged jitter windows of FIGS. 5A and 5B, the jitter window in FIG. 5A can be shifted to left side so as to correspond to the jitter window of FIG. 5B, final jitter window becomes like one illustrated in FIG. 5C and expressed by equation 8, under the condition of making $t_D = t_{UD}$. The equation 8 shows that the jitter window is reduced by as much as $t_{UD}$ by being compared with the case of equation 4.

$-\Delta_{PD} - t_D < JW_{a2} < \Delta_{PD} + t_{UD} - t_D$  [Equation 6]

$-\Delta_{PD} - t_{UD} < JW_{b2} < \Delta_{PD}$  [Equation 7]

$-\Delta_{PD} - t_{UD} < JW_{f2} < \Delta_{PD}$  [Equation 8]

However, the main phase determining circuit 300 has drawbacks, as shown in FIG. 5C, in that the jitter window is not symmetric with respect to the reference signal. If the jitter window is identical to that as shown in FIG. 5C, in the case that the phase of the input signal (dIILCK in the circuit in FIG. 1) lags behind the phase of the reference signal (exCLK in the circuit of FIG. 1), the jitter performance is inferior relative to one in the case that the phase of the input signal leads the phase of the reference signal. Moreover, though the jitter window is reduced in the main phase determining circuit 300, the maximum phase error keeps unreduced magnitude of $\Phi_{MAX} = -(\Delta_{PD} + t_{UD})$.

SUMMARY OF THE INVENTION

Accordingly, the present invention has been made to solve the above-mentioned problems occurring in the prior art, and an object of the present invention is to provide a delay locked loop circuit with a jitter performance improved in reducing both an error of a phase determining circuit and a unit delay in a variable delay line.

Another object of the present invention is to provide a delay locked loop circuit with a jitter window being symmetric to a reference signal.

Still another object of the present invention is to provide a delay locked loop circuit with improved maximum phase error.

Still another object of the present invention is to provide a delay locked loop circuit with an improved jitter performance and a simple structure.

In order to accomplish this object, there is provided a delay locked loop circuit with a novel structure for improving a jitter performance. In accordance with the aspect of the present invention, the delay locked loop circuit includes a delay circuit for receiving an input clock signal and generating a delayed output clock signal. The delay circuit has a predetermined minimum variable delay, and the delayed output clock signal is delayed with respect to the input clock signal by a delay period to be determined in accordance with a delay control signal that is inputted into the delay circuit. Moreover, the delay locked loop circuit includes a phase determining block for receiving the input clock signal and the output clock signal, generating a phase pull signal when the phase of an input clock signal being delayed by as much as a first predetermined time period leads the phase of the output clock signal, and generating a phase push signal when a phase of the input clock signal lags behind the phase of an output clock signal being delayed by as much as a second predetermined time period, and a delay control circuit for generating the delay control signal for controlling the delay circuit to reduce the delay when the phase pull signal is received from the phase determining block and to increase the delay when the phase push signal is received from the phase determining block. The delay control circuit does not change the delay of the delay circuit when neither the phase pull signal nor the phase push signal is received from the phase determining block. According to the aspects of the delay locked loop circuit of the present invention, the jitter performance can be enhanced while remaining the minimum variable delay of the delay circuit. Moreover, it is possible to obtain a jitter window symmetric to the reference signal as well as to reduce the maximum phase error. If a delay locked loop circuit having these characteristics is realized, there is advantage of being able to provide a delay locked loop circuit of even simpler structure.

In accordance with another aspect of the present invention, the phase determining block preferably includes a first delay section for receiving the input clock signal and generating an input clock signal delayed by as much as the first predetermined time period, a second delay section for receiving the output clock signal and generating an output clock signal delayed by as much as the second predetermined time period, a first phase determining section for receiving the delayed input clock signal and the output clock signal, and for generating the phase pull signal when the phase of the delayed input clock signal leads the phase of the output clock signal, and a second phase determining section for receiving the input clock signal and the delayed output clock signal and generating the phase push signal when the phase of the input clock signal lags behind the phase of the delayed output clock signal. By doing so, the phase determining block can be constructed with minimal structural elements.

Moreover, the phase determining block can be constructed with a first delay section for receiving the input clock signal and generating an input clock signal delayed by as much as the first predetermined time period, a second delay section for receiving the output clock signal and generating an output clock signal delayed by as much as the second predetermined time period, a first phase determining section for receiving the delayed input clock signal and the output clock signal, and for generating a first phase pull signal when the phase of the delayed input clock signal leads the phase of the output clock signal, and a first phase push signal when the phase of the delayed input clock signal lags behind the phase of the output clock signal, a second phase determining section for receiving the input clock signal and the delayed output clock signal, and for generating a second phase pull signal when the phase of the input clock signal leads the phase of the delayed output clock signal, and a second phase push signal when the phase of the input clock signal lags behind the phase of the delayed output clock signal, a third phase determining section for receiving the input clock signal and the output clock signal, and for generating a third phase pull signal when the phase of the input clock signal leads the phase of the output clock signal, and a third phase push signal when the phase of the input clock signal lags the phase of the output clock signal, a first logic product means for generating the phase pull signal by logically multiplying the first through the third phase pull signals, and a second logic product means for generating the phase push signal by logically multiplying the first through the third phase push signals.

Preferably, the first time period is a half of the minimum variable delay. Moreover, the second predetermined time period is a half of the minimum variable delay. When the first and second predetermined time periods are equal to a half of the minimum variable delay, the jitter windows of the signal PUSH and PULL can overlap well, and since the final jitter window is symmetric to the reference signal, optimal jitter performance can be obtained.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 6:
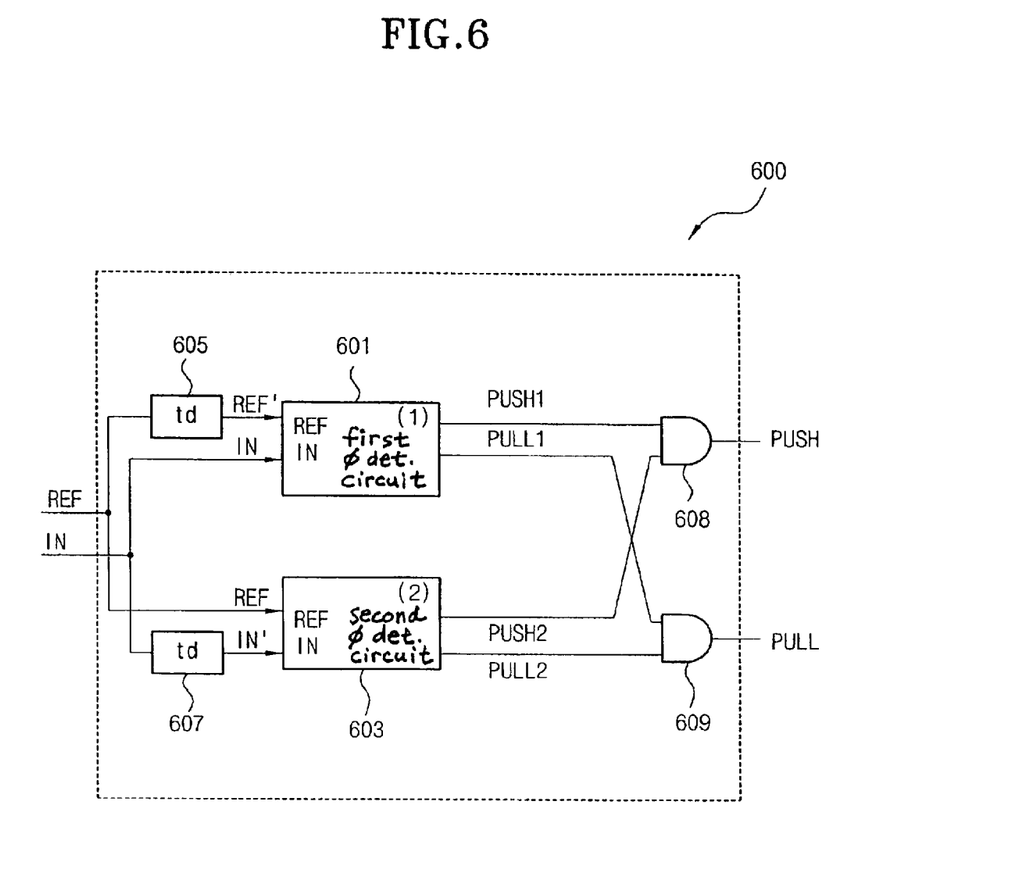
FIG. 6 is a block diagram of a delay locked loop circuit according to a first embodiment of the present invention.

FIG. 6 is a block diagram showing the delay locked loop circuit according to a first preferred embodiment of the present invention. The main phase determining circuit 600, as shown in FIG. 6, includes two phase determining circuits 601 and 603, two delay components 605 and 607, and two AND gates 608 and 609. The main phase determining circuit 600 is comprised of an added delay component 605 for delaying the reference signal REF to the main phase determining circuit 300 in FIG. 3.

Figure 7:
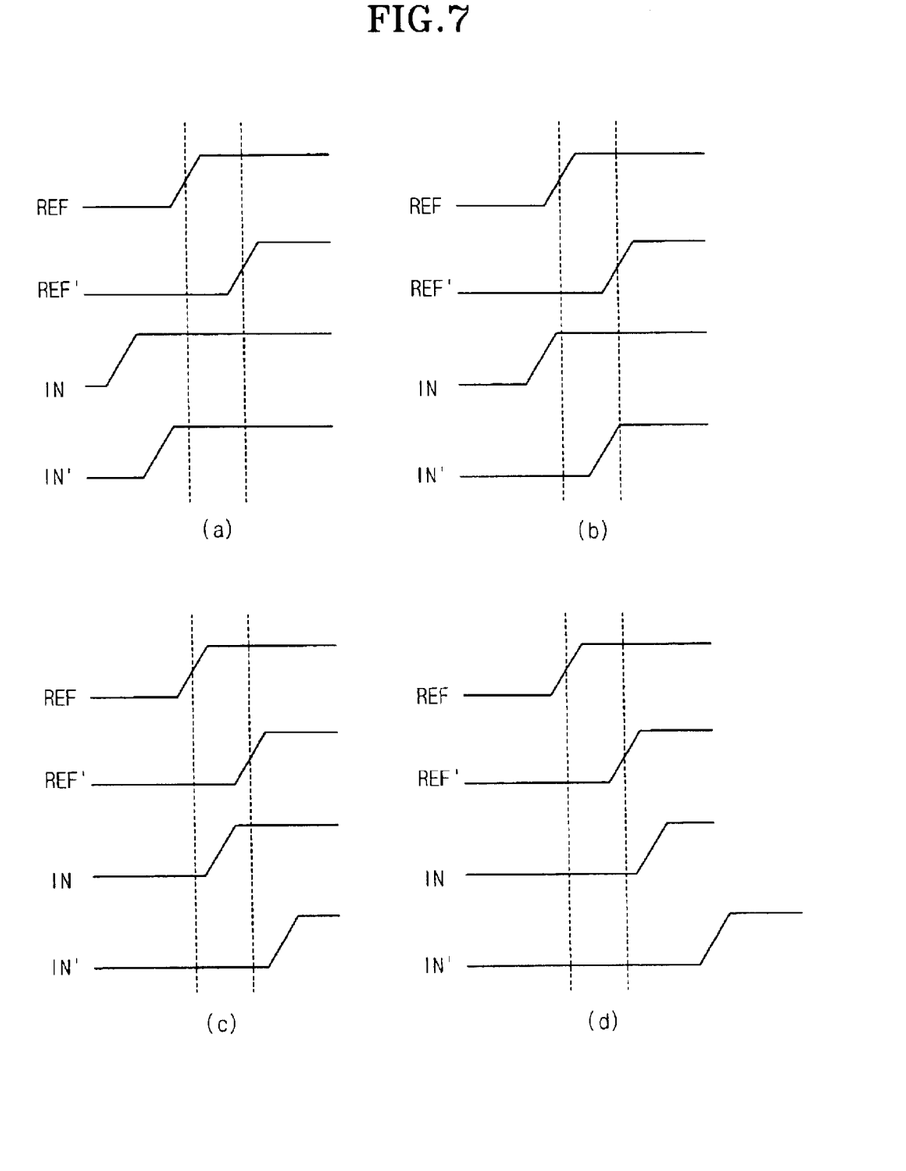
FIG. 7 is a view illustrating an operation principle of the circuit in FIG. 6.

The delay component 605 generates a signal REF by delaying the reference REF by $t_D$. The reference signal REF is directly provided to a reference signal terminal REF of the second phase determining circuit 603. The delay component 607 generates a signal IN' by delaying the input signal IN by $t_D$ and provides the generated signal IN to an input signal terminal IN of the second phase determining circuit 603. In the first phase determining circuit 601, the input signal IN is provided to the input signal terminal IN without passing through any delay components. A pull signal PULL of the main phase determining circuit 600 is generated from an operation of an output PULL1 from the first phase determining circuit 601 and an output PULL2 from the second phase determining circuit 603 in the AND gate 609. The push signal PUSH of the main phase determining circuit 600 is generated from a logical operation of an output PUSH1 from the first phase determining circuit 601 and an output PUSH1 from the second phase determining circuit 603 in the AND gate 608. However, the output PULL1 of the first phase determining circuit 601 is used as the pull signal PULL without logical operation, and the output PUSH2 from the second phase determining circuit 603 is used as the signal PUSH as it is without any logical operation. Hereinafter, the operational principle of the circuit as shown in FIG. 6 will be explained with reference to FIG. 7. In the respective graphs of FIG. 7, it is noticed that the respective signals REF' are delayed by to and the signal IN' is also delayed by to. FIG. 7A shows a case in which both of the phases of the signals IN and IN' lead the phase of both of the signals REF and REF'. In this case, both of the phase determining circuits 601 and 603 determine the activation of PUSH. Namely, since the result of the determination becomes PUSH1=high, PULL1=low, PUSH2=high, and PULL2=low, the output PUSH from the main phase determining circuit 600 becomes high as the signal PUSH2 and the output PULL becomes low as the signal PULL1. Therefore, the main phase determining circuit 600 finally determines PUSH.

FIG. 7B shows a case that the phase of the signal IN leads me phases of the signals REF and REP', and the phase of the signal IN' lags behind the phase of the signal REF but leads the phase of the signal REF'. In this case, the first phase determining circuit 601 determines the signal PUSH by comparing the signal IN and the signal REP', and the second phase determining circuit 603 determines the signal PULL by comparing the signal IN' and the signal REF. Namely, since the result becomes PULL1=low and PUSH2=high, the output PUSH from the main phase determining circuit 600 becomes low and the output PULL therefrom becomes low. Since none of outputs from the main phase determining circuit 600 is high, nothing is finally determined through the main phase determining circuit 600.

FIG. 7C illustrates a case that the phase of the signal IN lags the phase of the signal REF but leads the phase of the signal REF', and the phase of the signal IN' lags behind the phases of the signals REF and REF'. In this case, the first phase determining circuit 601 determines the signal PUSH by comparing the signal IN and the signal REP', and the second phase determining circuit 603 determines the signal PULL by comparing the signal IN' and the signal REF. Therefore, as the case of FIG. 7C, nothing is finally determined by the main phase determining circuit 600.

FIG. 7D illustrates a case that both of the phases of the signals IN and IN' lag the phases of the signals REF and REF'. In this case, the phase determining circuits 601 and 603 determine PULL. Namely, since the result of the determination become PUSH1=low, PULL1=high, PUSH2=low, and PULL2=high, the output PUSH from the main phase determining circuit 600 becomes low as the PUSH2 and other output PULL therefrom becomes high as the PULL1. Therefore, PULL is finally determined through the delay main phase determining circuit 600.

Figure 8:
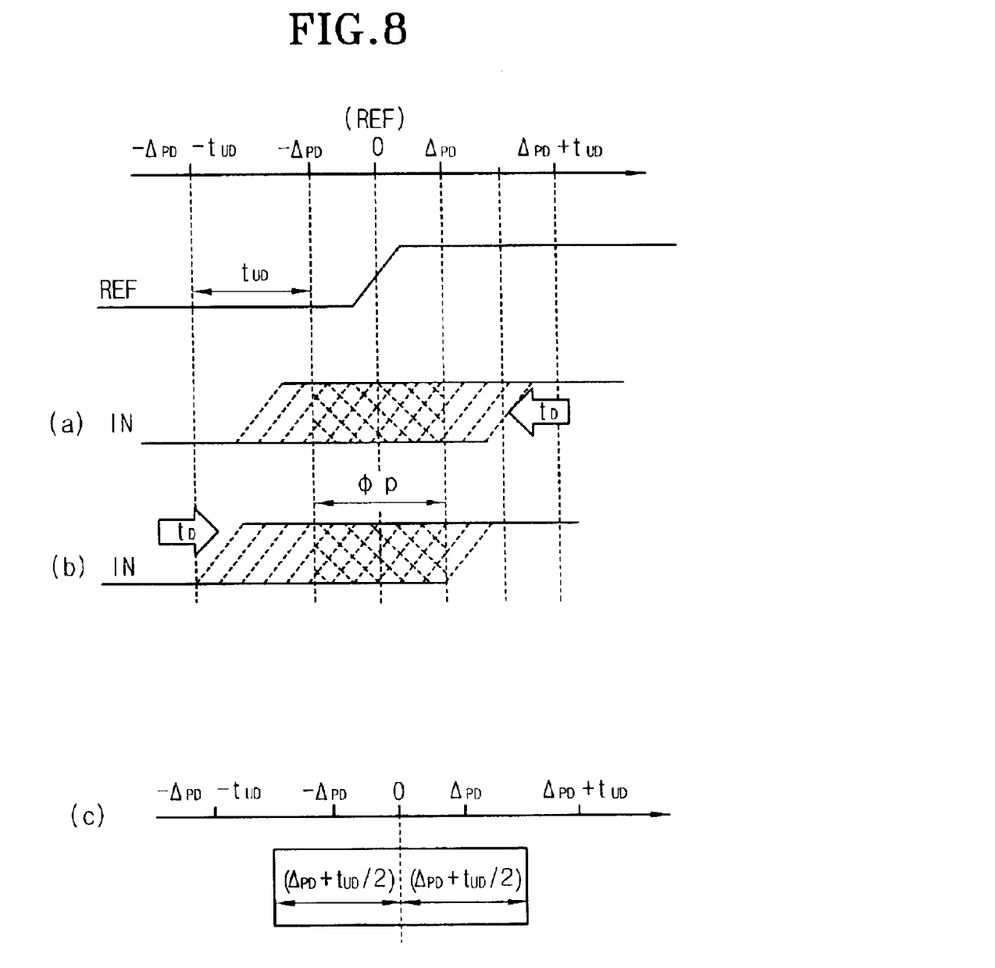
FIG. 8 is a view illustrating the jitter performance of the circuit in FIG. 6.

FIG. 8 shows the jitter performance of the circuit of FIG. 6. FIG. 8A illustrates a jitter window of PUSH, FIG. 8B illustrates a jitter window of PULL, and FIG. 8C illustrates a final jitter window. In FIG. 8, $\Phi_P$ is derived from the error caused by the phase determining circuit in the same manner as the case of FIG. 2. By referring FIG. 8A, the jitter window in the case of PUSH is extended to the right side as much as the unit delay $t_{UD}$ in the delay circuit. Since the output PUSH from the main phase determining circuit 600 of FIG. 6 is generated by the second phase determining circuit 603 and the input signal IN' is compared with the reference signal REF after being delayed by to, the jitter window is shifted to the left side by to. Therefore, the jitter window of PUSH is expressed by the equation 9. In contrast, as shown in FIG. 8B, the jitter window in the case of PULL is extended to the left side as much as unit delay $t_{UD}$ in the delay circuit. Since the output PULL from the main phase determining circuit 600 of FIG. 6 is generated by the first phase determining circuit 601 and the reference signal REF' is compared with the input signal IN after being delayed, the jitter window is shifted to the right side by to. Therefore, the jitter window of PULL is expressed by the equation 10. It can be understood that the jitter window is optimized when the delay to is a half of the unit delay $t_{UD}/2$ from FIGS. 8A and 8B. FIG. 8C illustrates the jitter window when the delay to is half of the unit delay $t_{UD}/2$. The jitter window is expressed by the equation 11, and maximum phase error $\Phi_{MAX3}$ at that time is expressed the equation 12.

$$-\Delta_{PD}-t_D<JW_{a3}<\Delta_{PD}+t_{UD}-t_D \quad \text{[Equation 9]}$$

$$-\Delta_{PD}-t_{UD}+t_D<JW_{b3}<\Delta_{PD}+t_D \quad \text{[Equation 10]}$$

$$-\Delta_{PD}-t_{UD}/2<JW_{b3}<\Delta_{PD}+t_D/2 \quad \text{[Equation 11]}$$

$$|\Phi_{MAX3}|=\Delta_{PD}+t_{UD}/2 \quad \text{[Equation 12]}$$

As understood from equation 12, the main phase determining circuit 600 according to the preferred embodiment of the present invention has a maximum phase error lower by as much as $t_{UD}/2$ less than that of the conventional main phase determining circuit 300 shown in FIG. 3.

As described above, the present invention uses two phase determining circuits and two delay components so as to properly overlap the jitter window of PUSH and the jitter window of PULL, so that it has advantages of improving the final jitter performance and maximum phase error toward the delay locked loop circuit, including the given phase determining circuit and delay circuit. Moreover, a delay locked loop circuit having a jitter performance symmetric to the reference signal with a simple structure can be provided.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A delay locked loop circuit with an improved jitter performance, comprising:

a variable delay circuit for receiving a reference clock signal and generating a delayed output clock signal, based at least on a predetermined variable delay from the reference clock signal;

a main phase determining circuit for receiving the reference clock signal and the output clock signal, and generating a phase pull signal and a phase push signal, the main phase determining circuit comprising:

a first delay circuit for receiving the reference clock signal and delaying the reference signal by a first predetermined time period;

a second delay circuit for receiving the output clock signal and delaying the output clock signal by a second predetermined time period;

a first phase determining circuit for receiving the delayed reference clock signal and the output clock signal, and for generating a first phase pull signal when the phase of the delayed input clock signal leads the phase of the output clock signal, and a first phase push signal when the phase of the delayed input clock signal lags behind the phase of the output clock signal;

a second phase determining circuit for receiving the reference clock signal and the delayed output clock signal, and for generating a second phase pull signal when the phase of the input clock signal leads the phase of the delayed output clock signal, and a second phase push signal when the phase of the input clock signal lags behind the phase of the delayed output clock signal;

wherein the phase pull signal is generated when both the first and second pull signals are logically high, and wherein the phase push signal is generated when both the first and second push signals are logically high; and a delay control circuit for generating a delay control signal for controlling the predetermined variable delay.

2. The delay locked loop circuit as claimed in claim 1, wherein the predetermined variable delay is not changed when neither the phase pull signal nor the phase push signal is received from the phase determining block.

3. The delay locked loop circuit as claimed in claim 1, wherein the predetermined variable delay is reduced when the phase pull signal is received from the main phase determining block and the predetermined delay is increased when the phase push signal is received from the main phase determining block.

4. The delay locked loop circuit as claimed in claim 1, wherein the first predetermined time period is half the predetermined variable delay.

5. The delay locked loop circuit as claimed in claim 1, wherein the second predetermined time period is half the predetermined variable delay.

6. The delay locked loop circuit as claimed in claim 1, wherein each of the first and second predetermined time periods is half the predetermined variable delay.

7. The delay locked loop circuit as claimed in claim 1, further comprising a clock buffer for receiving a the reference clock signal and generating a buffered reference clock signal, wherein the buffered reference clock signal is provided to the delay circuit, and the reference clock signal is provided to the main phase determining block.

8. In a delay locked loop, which receives, a reference clock signal having a reference phase and generates an output clock signal having an output phase, comprising a main phase determining circuit that generates a phase push signal and a phase pull signal based on the received reference clock signal and the output clock signal to control the difference between the reference phase and the output phase within a predetermined range, the main phase determining circuit comprising:

a first delay circuit for receiving the reference clock signal and delaying the reference signal by a first predetermined time period;

a second delay circuit for receiving the output clock signal and delaying the output clock signal by a second predetermined time period;

a first phase determining circuit for receiving the delayed reference clock signal and the output clock signal, and for generating a first phase pull signal when the phase of the delayed input clock signal leads the phase of the output clock signal, and a first phase push signal when the phase of the delayed input clock signal lags behind the phase of the output clock signal;

a second phase determining circuit for receiving the reference clock signal and the delayed output clock signal, and for generating a second phase pull signal when the phase of the input clock signal leads the phase of the delayed output clock signal, and a second phase push signal when the phase of the input clock signal lags behind the phase of the delayed output clock signal;

wherein the phase pull signal is generated when both the first and second pull signals are logically high, and wherein the phase push signal is generated when both the first and second push signals are logically high.

9. A delay locked loop circuit with an improved jitter performance, comprising:

a clock buffer for receiving a reference clock signal having a reference phase and generating a buffered reference clock signal;

a delay circuit for receiving the reference clock signal and generating a delayed output clock signal, based at least on a predetermined variable delay, the output clock signal having an output phase a main phase determining circuit for receiving the reference clock signal and the output clock signal, generating a phase pull signal when the reference phase leads the output, phase by a first predetermined time period and generating a phase push signal when the reference phase lags the output phase by a second predetermined time period; and a delay control circuit for generating a delay control signal for controlling the predetermined variable delay when the phase pull signal is received from the main phase determining block and to increase the predetermined variable delay when the phase push signal is received from the main phase determining block;

wherein the main phase determining comprises:

a first delay circuit for receiving the reference clock signal and delaying the reference clock signal by as much as the first predetermined time period;

a second delay circuit for receiving the output clock signal and delaying the output clock signal by as much as the second predetermined time period;

a first phase determining section for receiving the delayed reference clock signal and the output clock signal, and for generating the phase pull signal when the reference phase leads the output phase; and a second phase determining section for receiving the reference clock signal and the delayed output clock signal, and for generating the second phase push signal when the reference phase lags the output phase.

10. The delay locked loop circuit as claimed in claim 9, wherein the predetermined variable delay is not changed when neither the phase pull signal nor the phase push signal is received from the main phase determining block.

11. The delay locked loop circuit as claimed in claim 9, wherein the first predetermined time period is half the predetermined variable delay.

12. The delay locked loop circuit as claimed in claim 9, wherein the second predetermined time period is half the predetermined variable delay.

13. The delay locked loop circuit as claimed in claim 9, wherein each of the first and second predetermined time periods is half the predetermined variable delay.

14. A delay locked loop circuit with an improved jitter performance, comprising:

a clock buffer for receiving an external clock signal and generating a buffered input clock signal;

a delay circuit for receiving the input clock signal and generating a delayed output clock signal, the delay circuit having a predetermined minimum variable delay, and the output clock signal being delayed with respect to the input clock signal by a delay period to be determined in accordance with a delay control signal which is inputted into the delay circuit;

a phase determining block for receiving the external clock signal and the output clock signal, generating a phase pull signal when a phase of the external clock signal being delayed by as much as a first predetermined time period leads a phase of the output clock signal, and generating a phase push signal when a phase of the external clock signal lags a phase of an output clock signal delayed as much as a second predetermined time period; and a delay control circuit for generating the delay control signal for controlling the delay circuit to reduce the delay when the phase pull signal is received from the phase determining block and to increase the delay when the phase push signal is received from the phase determining block;

wherein the phase determining block includes:
- a first phase determining section for receiving the delayed external clock signal and the output clock signal, and for generating a first phase pull signal when the phase of the delayed external clock signal leads the phase of the output clock signal, and a first phase push signal when the phase of the delayed external clock signal lags behind the phase of the output clock signal;
- a second phase determining section for receiving the external clock signal and the delayed output clock signal, and for generating a second phase pull signal when the phase of the external clock signal leads the phase of the delayed output clock signal, and a second phase push signal when the phase of the external clock signal lags behind the phase of the delayed output clock signal;
- a third phase determining section for receiving the external clock signal and the output clock signal, and for generating a third phase pull signal when the phase of the external clock signal leads the phase of the output clock signal, and a third phase push signal when the phase of the external clock signal lags behind the phase of the output clock signal;
- a first logic product means for generating the phase pull signal by logically multiplying the first through the third phase pull signals; and
- a second logic product means for generating the phase push signal by logically multiplying the first through the third phase push signals.

15. The delay locked loop circuit as claimed in claim 14, wherein the delay control circuit does not change the delay of the delay circuit when neither the phase pull signal nor the phase push signal is received from the phase determining block.

16. The delay locked loop circuit as claimed in claim 14, wherein the first predetermined time period is a half of the minimum variable delay.

17. The delay locked loop circuit as claimed in claim 14, wherein the second predetermined time period is a half of the minimum variable delay.

18. The delay locked loop circuit as claimed in claim 14, wherein the first and second predetermined time periods are a half of the minimum variable delay.

* * * * *